May 13, 1969 M. SHERMAN 3,444,473

FAST RECOVERY READ AMPLIFIER

Filed Dec. 23, 1965 Sheet 1 of 2

FIG. I

INVENTOR.
MICHAEL SHERMAN

BY Joseph R. Dwyer
ATTORNEY

May 13, 1969 M. SHERMAN 3,444,473
FAST RECOVERY READ AMPLIFIER
Filed Dec. 23, 1965 Sheet 2 of 2

INVENTOR.
MICHAEL SHERMAN
BY Joseph R. Dwyer
ATTORNEY 3,444,473
FAST RECOVERY READ AMPLIFIER
Michael Sherman, Granada Hills, Calif., assignor to Singer-General Precision, Inc., a corporation of Delaware
Filed Dec. 23, 1965, Ser. No. 515,929
Int. Cl. H03f 3/68; H03k 17/26, 17/28
U.S. Cl. 330—30 4 Claims

ABSTRACT OF THE DISCLOSURE

A read amplifier particularly suitable for high speed readout of magnetic memory elements uses a pair of DC amplifiers coupled by a delay line. Pulse pairs of opposite polarity are fed into the amplifiers. The output signal from each amplifier is used to quench the output of the opposite amplifier after the delay period of the delay line to provide a fast recovery for each DC amplifier.

This invention relates to electronic amplifier circuits, and more particularly to a novel and improved difference amplifier which provides an AC signal from a digital pulse with its opposing polarity being of a predetermined timed duration to provide fast recovery of the components therein.

Heretofore it has been found that conventional AC amplifiers will acquire a bias on its coupling capacitors or transformers during a long string of input noise or signal pulses of a single polarity, since they do not pass the DC components of a string of pulses of a single polarity.

A DC amplifier eliminates the recovery problems that are inherent in these types of AC amplifiers due to the coupling components, but introduces new ones. If the input signal is a few millivolts, drift in the characteristics of the input stage due to time and temperature variations is significant in relation to the signal and appears as a noise component or a false signal on the output.

Due to the advent of high speed thin film memories, a need has developed for a read-record amplifier which must be able to recover quickly from relatively high noise pulses occurring during write operations, and yet must produce an output for a given input signal which is completely independent of the pattern of noise in read pulses preceding it.

Briefly described, this invention provides an electronic circuit embodying a two-stage differential amplifier. The input stage being, for example, common emitter configurations with series current feedback which drives a second differential common emitter stage with parallel voltage feedback, thus providing a high gain bandwidth product which is desirable for pulse amplification. A delay line is then inserted between the amplifier stages so that a signal is produced of opposite polarity to the original pulse delayed by the time delay of the delay line.

It, therefore, becomes one object of this invention to provide a new and improved read-record amplifier for use with high speed thin film memories, or the like, and which amplifies read pulses without distortion and yet does not acquire a bias from a string of input pulses of like polarity.

Another object of this invention is to provide a new and improved electronic amplifier circuit which has no DC content, thus allowing higher level amplifiers which follow to, therefore, be AC coupled.

Figure 1:
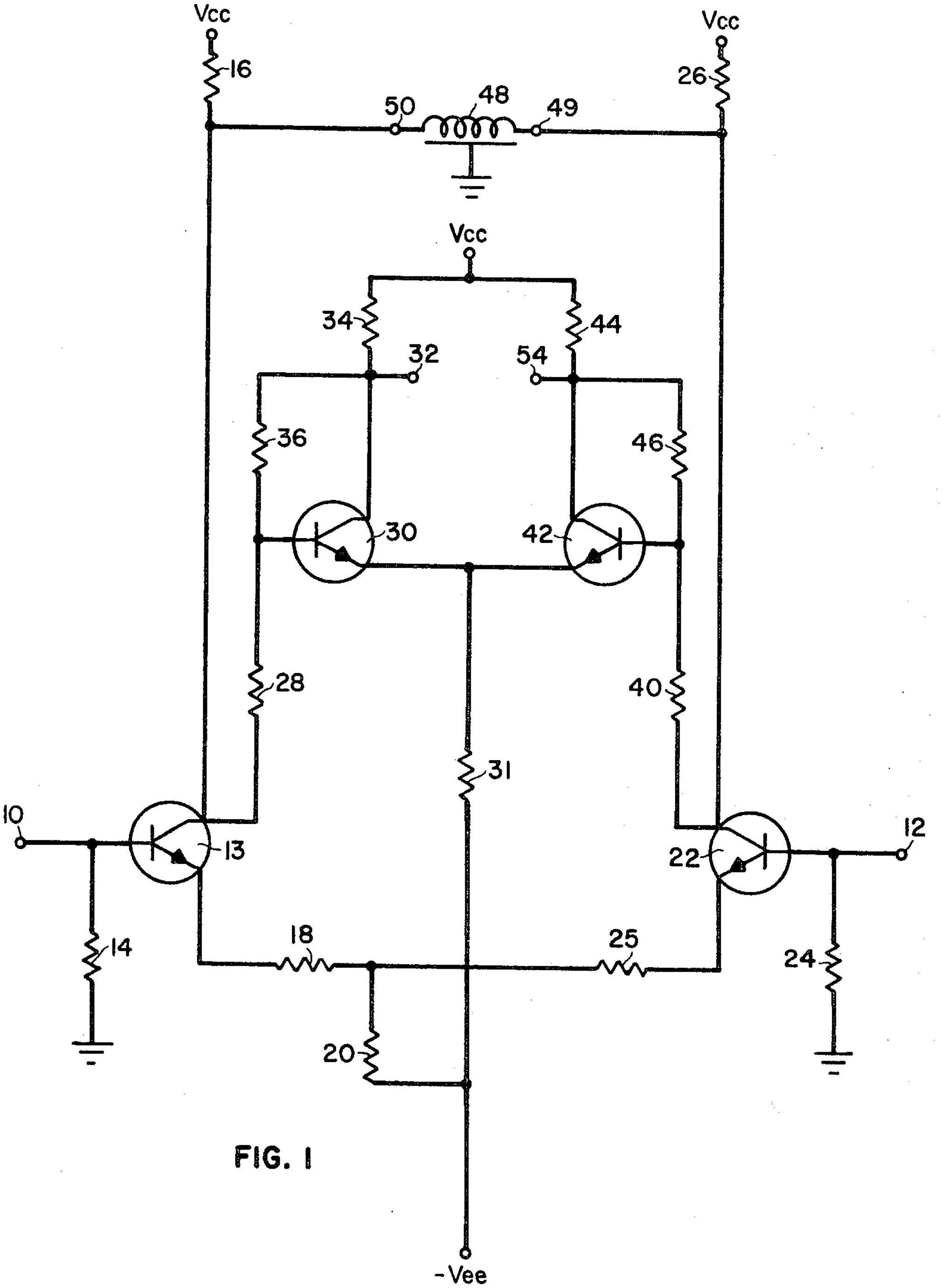
Figure 2:
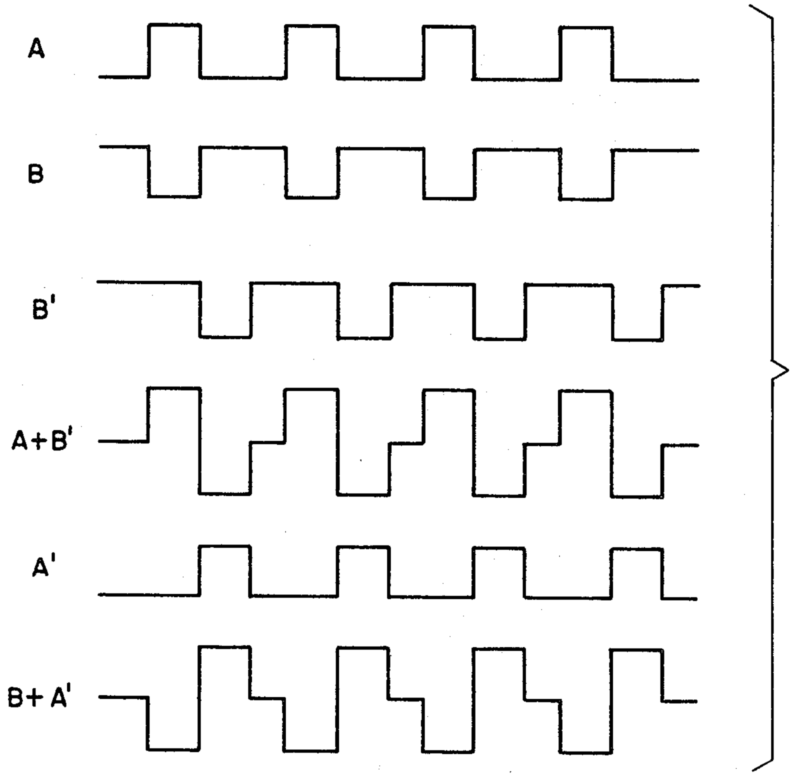
Figure 3:
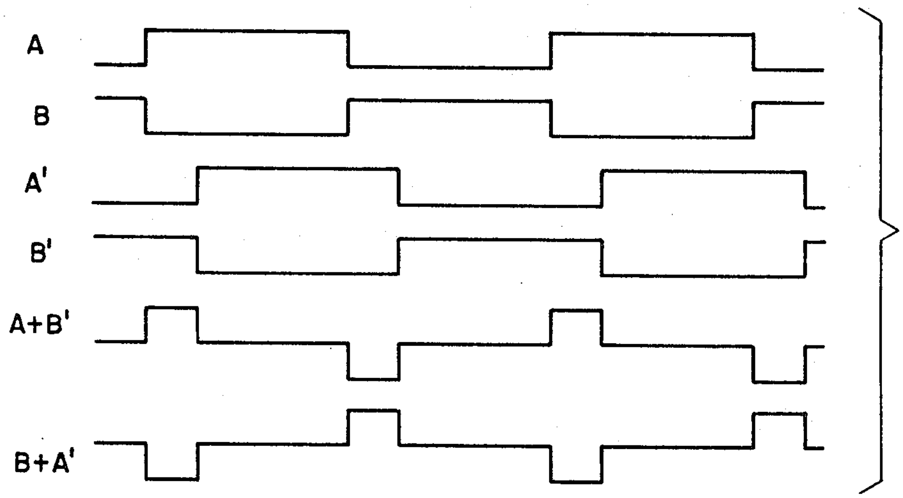

These and other objects will become apparent to those of ordinary skill when consideirng the following detailed description in which the following figures illustrate one embodiment of this invention, and wherein:

FIGURE 1 is an electrical schematic drawing of a circuit embodying this invention, FIGURE 2 is a graphic illustration of a typical waveform as inputs and outputs of the circuits shown in FIGURE 1, and FIGURE 3 is a graphic illustration of a typical waveform with longer pulse durations than shown in FIGURE 2 displaying the inputs and outputs when introduced into the circuit shown in FIGURE 1.

Turning now to a more detailed description of the embodiment shown in the figures, there is shown a difference amplifier comprising a pair of inputs designated by the numerals 10 and 12. These inputs can receive signals, for example, of opposing polarities, such as generated in the digit lines of a plated wire memory, or the like. Input path from terminal 10 is coupled directly into the base of an NPN transistor 13 which provides a first input stage of the difference amplifier. The base of transistor 13 is coupled to the resistor 14 to a ground potential. This resistor 14 may, for example, have a resistance value of 1K, or may be the actual terminating resistor to match digit line characteristic impedance. The collector of transistor 13 is coupled to a collector voltage designated $V_{CC}$ through a resistor 16, which may, for example, have a resistance of 4.3K, while the emitter of transistor 13 is coupled in series with a feedback resistor 18 which may have, for example, a resistance of 51 ohms. Also coupled in series with the resistor 18 is the resistor 20 which has the other end thereof coupled to a voltage potential opposite a $V_{CC}$ and designated as $-V_{EE}$.

The terminal 12 which is an input terminal similar to that of input path and terminal 10 may, for example, receive a signal of opposing polarity as that which would be applied to terminal 10 or may be referenced to ground. This terminal is coupled to the base of transistor 22 which has its base coupled to ground through the resistor 24 which may have, for example, a 1K resistance. The emitter of transistor 22 is coupled in series with the resistor 25 and also coupled in series with resistor 20. Resistor 25 may have a resistance of 51 ohms, for example. The collector of transistor 22 is coupled to the voltage source $V_{CC}$ through the resistance 26, which provides the current for operation of transistor 22. The transistors 13 and 22, for this invention, operate as Class A amplifiers, wherein variations of the signals on the input terminals 10 and 12 will cause variations upon collector currents derived therefrom. The collector of transistor 13 is coupled to a terminating resistor 28 which may have a resistance of 270 ohms which is used for further operation of this invention and will be explained later. The other lead of terminating resistor 28 is coupled to the base of transistor 30 which may have its emitter coupled to a common resistor 31 which may have a 3.3K resistance, for example. The collector of transistor 30 is coupled through a 3.3K resistor 34 which may have, for example, a resistance of 1.5K to the collector voltage $V_{CC}$. A feedback line is coupled through a 3.3K resistor 36 to the base of transistor 30.

The collector of transistor 22 is coupled through a second terminating resistor 40 to the base of transistor 42 and the emitter of transistor 42 is coupled to the emitter of transistor 30 and, likewise, to the base of the common resistor 31. The collector of transistor 42 is coupled to the collector voltage terminal, $V_{CC}$, through resistor 44 which may have, for example, a resisance of 1.5K. A feedback line connects the collector of transistor 42 through the resistance 46, which may have a resistance of 3.3K back to the base of transistor 42.

The collector of transistor 13 is coupled to the collector of transistor 22 through a delay line 48 which may have 50 nanoseconds delay time. The delay line 48 may have a characteristic impedance of 300 ohms.

Signals from the collectors of transistors 13 and 22, which are the results of input signals presented to terminals 10 and 12, are presented to terminals 49 and 50 of the delay line 48 simultaneously. These signals appear at opposing polarities, as illustrated by the signals A and B, as shown in the graphs of FIGURE 2. The signal B appearing at the collector of transistor 22 will be presented at one end of the delay line 48, designated as terminal 49 and will pass through the delay line 48 and appear at terminal 50 delayed by 50 nanoseconds, for example, as shown in FIGURE 2 by the Graph B′. Signal A will appear at the collector of transistor 13 and appear at terminal 50 of delay line 48 and pass through the delay line 48 and appear at terminal 49 as signal A′ of FIGURE 2 and be delayed by 50 nanoseconds. Signal A is added to B′ at terminal 50 and will appear as $A+B'$, as shown in FIGURE 2. Likewise, the signal A′ appearing at terminal 49 will be added to the signal B and will appear as $B+A'$. These signals will be presented to the terminating resistors 28 and 40 and further amplified through the second stage of the difference amplifiers, and appear at the outputs 32 and 54 without the DC component.

In the plated wire memory matrices write signals are about one thousand times greater than the read signals and if the write amplifiers are placed on one end of a plated wire and the read amplifiers on the other wire, the read amplifiers must be capable of taking the excessive currents required by the write amplifiers and still recover in time to sense a read signal. Thus, the amplifier must be able to handle these signals quickly, dispose of them, and be prepared for any oncoming read signals.

Write signals are normally of a longer duration compared to read signals, for example, 200 nanoseconds, as is shown by the graphs in FIGURE 3, and the operation of the opposing signals at the various terminals is identical with one exception, that the signals following the 50 nanoseconds delay will be appearing at the terminals at 50 and 49 at the same time, and being of equal amplitude and opposite polarities, these signals will cancel to a single reference.

It can now be seen that each pulse that appears in the difference amplifier receives a recovery pulse being the delayed 50 nanoseconds signal of the opposite polarity which will cause the components in this particular amplifier and any subsequent circuitry to recover and not acquire a DC bias component when a string of simultaneous pulses of the same polarity continuously appear as those that appear from or into digital thin film memories, or the like.

The terms thin film memories and plated wire woven memories are used interchangeably throughout this specification, and it must be understood that this invention will work equally well with either type memory, or for that matter with any signal source that may have high noise signals created therefrom. The amplifier must settle and recover therefrom quickly in order to receive and distinguish a relatively smaller signal.

Having thus shown one embodiment of this invention, what is claimed is:

1. A fast recovery electronic pulse amplifier comprising:
   first and second amplifiers in a differential amplifier configuration and responsive to a pair of simultaneous input signals of opposite polarities; and
   a delay line coupled across the output terminals of said first and second amplifiers, said delay line having a time delay corresponding to the desired recovery period of the read amplifier for applying time delayed opposed polarity recovery signals from said first amplifier to the output of said second amplifier, and from said second amplifier to the output of said first amplifier.

2. A fast recovery amplifier as claimed in claim 1, wherein the first and second amplifiers include transistors having a collector, emitter, and base, the input signals being applied to the base of said transistors, and said delay line being coupled across the collectors.

3. The fast recovery amplifier claimed in claim 1 further including a second differential amplifier coupled across said delay line and responsive to the signals from said first and second amplifiers and said delay line.

4. The fast recovery amplifier, as claimed in claim 3, further including terminating resistors coupled between the delay line and the second differential amplifier for absorbing signals passed through said delay line to prevent reflection thereof.

References Cited

UNITED STATES PATENTS

| | | | |
|---|---|---|---|
| 3,168,656 | 2/1965 | Kobbe | 307—293 X |
| 3,226,570 | 12/1965 | Rosenbaum | 307—293 X |
| 3,252,100 | 5/1966 | Webb | 307—293 X |
| 3,254,233 | 5/1966 | Kobayashi et al. | 307—293 X |

ROY LAKE, *Primary Examiner.*

L. J. DAHL, *Assistant Examiner.*

U.S. Cl. X.R.

260—920; 307—293; 424—211